United States Patent
Cheng et al.

(10) Patent No.: US 6,448,170 B1
(45) Date of Patent: Sep. 10, 2002

(54) METHOD OF PRODUCING EXTERNAL CONNECTOR FOR SUBSTRATE

(75) Inventors: Jao-Chin Cheng, Hsinchu; Chang-Chin Hsieh, Taipei; Bang-Chiung Liu; Chung-Yuan Chiu, both of Taoyuan, all of (TW)

(73) Assignee: Unimicron Technology Corp., Taoyuan Hsien (TW)

( * ) Notice: Subject to any disclaimer, the term of this patent is extended or adjusted under 35 U.S.C. 154(b) by 0 days.

(21) Appl. No.: 09/998,453

(22) Filed: Nov. 27, 2001

(51) Int. Cl.⁷ ............................................. H01L 21/44
(52) U.S. Cl. ..................... 438/612; 438/597; 257/693
(58) Field of Search .................. 438/612, 597; 257/693

Primary Examiner—Long Pham
(74) Attorney, Agent, or Firm—J.C. Patents

(57) ABSTRACT

A method of producing an external connector is provided. A substrate is provided and a plurality of pads are formed on the substrate. A copper layer is formed on the substrate to cover the pads. A patterned photoresist is formed on the copper layer. The patterned photoresist has a plurality of openings to expose the copper layer which corresponds to the pads. Then, a conductive plug is formed on the exposed copper layer. The patterned photoresist is removed, and the copper layer which is not covered by the conductive plug is subsequently removed. A solder resist is formed over the substrate to cover the pads and the conductive plug. A portion of the solder resist is removed until the conductive plug is exposed, wherein the solder resist is as high as the conductive plug.

15 Claims, 5 Drawing Sheets

METHOD OF PRODUCING EXTERNAL CONNECTOR FOR SUBSTRATE

BACKGROUND OF THE INVENTION

1. Field of the Invention

The present invention relates to a method of producing an external connector for a substrate. More specifically, the present invention relates to a method of producing an external connector for a substrate, which increases the number of the external connectors formed for the substrate compared to the prior art.

2. Description of the Related Art

As electronic appliances become smaller, lighter and thinner, semiconductor devices and the package thereof must also become compact. A printed circuit board (PCB), used as a substrate to connect to the semiconductor package, must be produced in an improved way so that the layout density of the PCB is increased. Currently, the opening used for forming a solder resist in the PCB has a diameter which has been decreased from about 100 microns to about 70–80 microns.

However, there still are several disadvantages in the prior art, recited as follows.

FIGS. 1–2 show a conventional external pad for a substrate in the prior art.

In FIG. 1, a plurality of external pads 102 is formed on the substrate 100. In FIG. 2, a patterned solder mask 112 is formed over the external pad 102a and the substrate 100 by exposure and development processes. The patterned solder mask 112 has a plurality of openings 112a which expose the external pad 102a.

Here, the solder mask 112 is formed of a high-dielectric material. The solder mask 112 provides not only protection for the external pad 102a and circuits (not shown), but also electric isolation of the external pad from the circuits.

However, due to a wet process such as the development process, a tapered opening 112a tends to be formed in the solder mask 112, especially when formed in a high-dielectric material. When taking into consideration the interval of the external pads and more effective contact area at the bottom of the external pad, the number of the external pads which can be formed in the substrate is limited by the taper shape of the opening. The tapered opening makes the exposed contact area of the external pad difficult to control.

Furthermore, if non-removed solder mask resides in the opening after the development process, it is not easy to completely remove it because the external pad 102a is lower than the solder mask 112. The residual solder mask in the opening leads to poor external contact or electric connection.

In view of foregoing, there are several problems encountered in the prior art. For example, it is not easy to effectively control the external contact area of the external pad 102a. It is also difficult to increase the yield of the external pad in the substrate if the residual solder mask in the opening can not be effectively removed.

SUMMARY OF THE INVENTION

It is an object of the present invention to provide a method of producing an external connector for a substrate, which can easily control the exposed external contact area of the external pad and increase the number of the external connectors formed in the substrate.

In order achieve the above and other objects of the present invention, a method of producing an external pad for a substrate is provided. The method of the present invention includes providing a substrate and a pad layer, then globally forming a copper layer over the substrate. A patterned photoresist layer is formed over the copper layer to expose a portion of the copper layer. A conductive plug is formed on the exposed copper layer. The patterned photoresist layer is removed and then the copper layer which is not covered by the conductive plug is removed to form an external connector consisting of the conductive plug, the copper layer under the conductive plug, and the pad. A solder resist layer is formed over the substrate and the conductive plug. The solder resist layer is removed until the conductive plug is exposed, to form a solder resist there between. The solder resist is as high as the external connector.

In the present invention, a plurality of external connectors is formed and each is spaced from the other and the solder resist is formed there between. The external connector is located at the same level as the solder resist. Therefore, the external connector obtained by the present invention facilitates the subsequent processes such as wire bonding between the chip and the substrate or bump bonding between the chip and the substrate.

Furthermore, the external connector is first formed, then the solder resist is formed. It is easy to control the exposed contact area of the external connector to increase the yield of the external connector on the substrate.

Since the photoresist has a dielectric constant smaller than the solder resist, a tapered opening is formed in the solder resist more easily than in the photoresist. Accordingly, variability encountered in forming an exposed external connector can be controlled much more exactly. Meanwhile, the prior problems related to residual in the defined solder resist can be also avoided.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1:
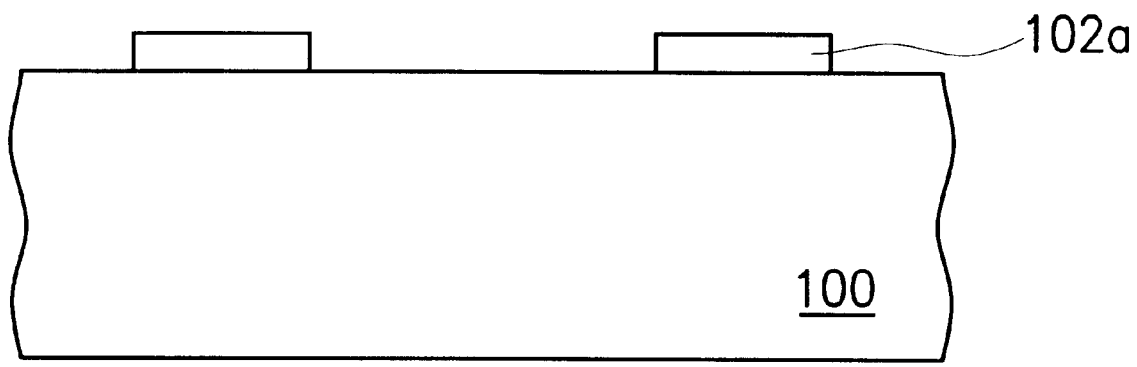
FIGS. 1–2 show a method of producing a conventional external pad on the substrate.

Reference will now be made in detail to the present preferred embodiments of the invention, examples of which are illustrated in the accompanying drawings. Whenever possible, the same reference numbers are used in the drawings and the description to refer to the same or like parts.

FIGS. 3–14 show a process of forming a connection pad for a substrate according to a preferred embodiment of the present invention.

Figure 6:
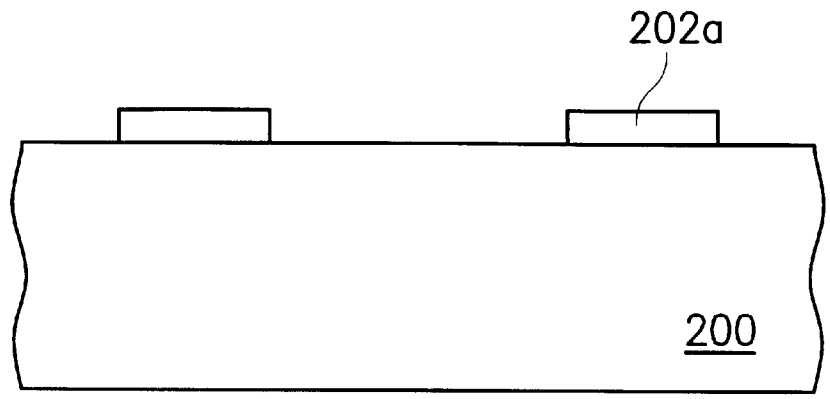

With reference to FIG. 6, a substrate 200 such as a printed circuit board is provided. The substrate 200 can be formed of a prepreg, such as a FR-4 substrate made of glass epoxy resin, a BT substrate made of bismaleimide triazine, epoxy substrate, or an insulation substrate. As shown, in FIG. 6, a pad layer 202 is provided over the substrate 200. An example of the material for the pad layer 202 includes copper. A plurality of pads 202a can be formed by performing photolithography and etching processes on the pad layer 202.

Figure 3:
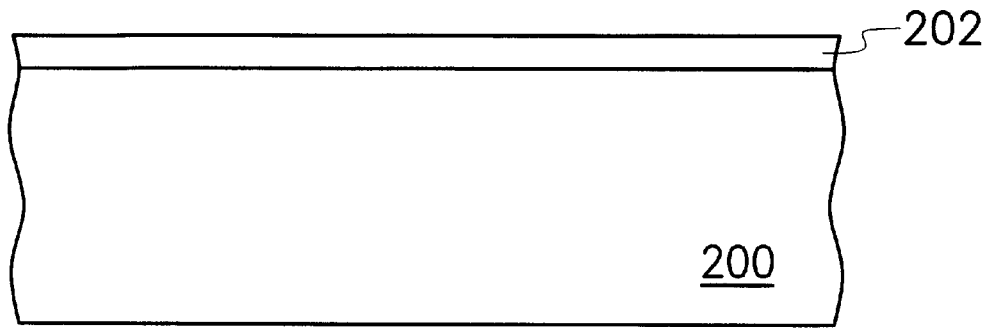
FIGS. 3–14 show a method of producing an external connector according to a preferred embodiment of the present invention.
Figure 4:
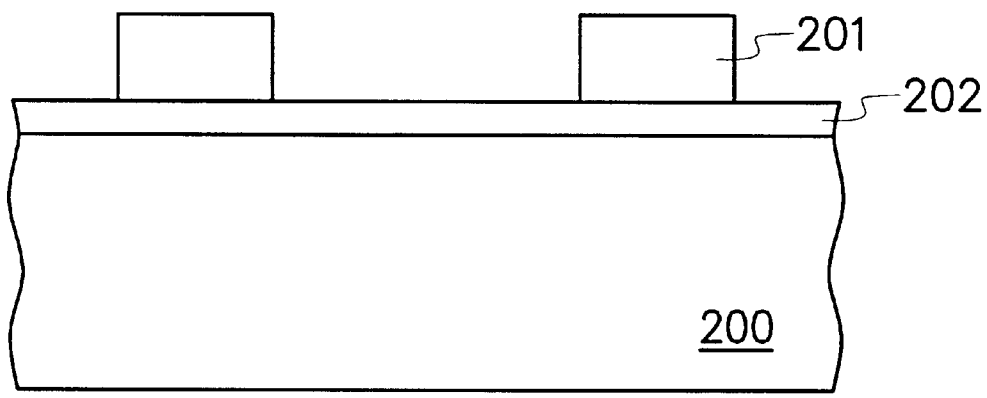
Figure 5:
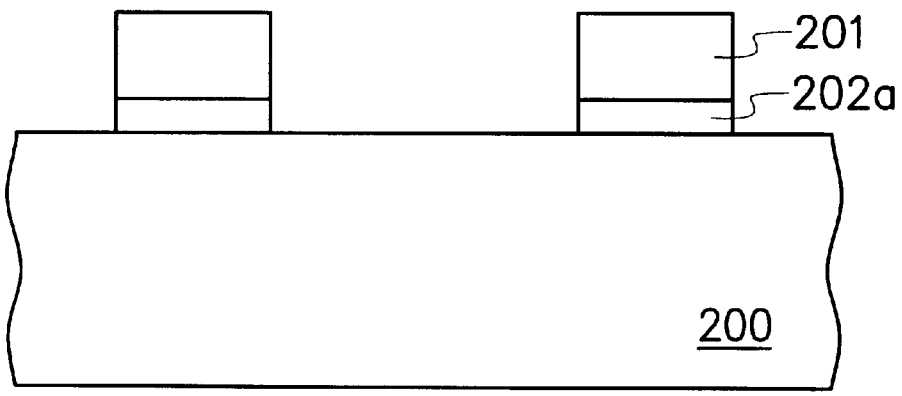

FIGS. 3–5 show the photolithography and etching process to form the pads. As shown in FIG. 3, a copper pad layer 202 is attached on the substrate 200. As shown in FIG. 4, a patterned photoresist 201 is formed on the pad layer 202 to expose portions of the pad layer to be removed later. In FIG. 5, the exposed pad layer 202 is removed to form a plurality of pads 202a. Removing the exposed pad layer 202 can achieved by etching, for example. Finally, the patterned photoresist 201 is removed, as shown in FIG. 6.

Figure 7:
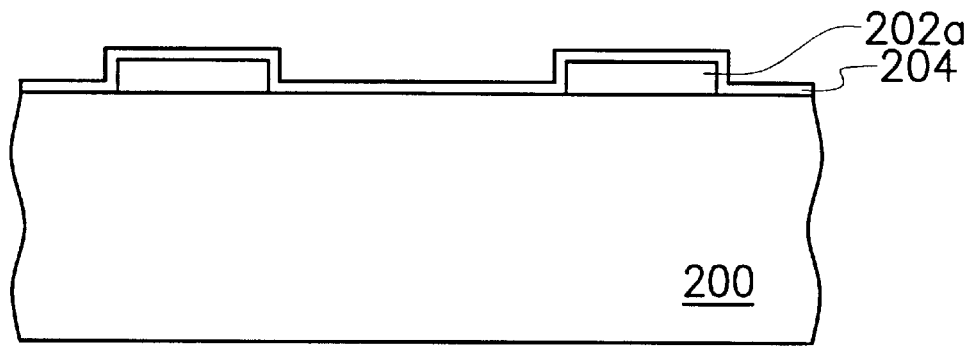

In FIG. 7, a copper layer 204 is formed on the whole surface of the substrate 200 and the pads 202a. The copper layer can be made of a reduced copper which is obtained by Oxide-Reduction.

Figure 8:
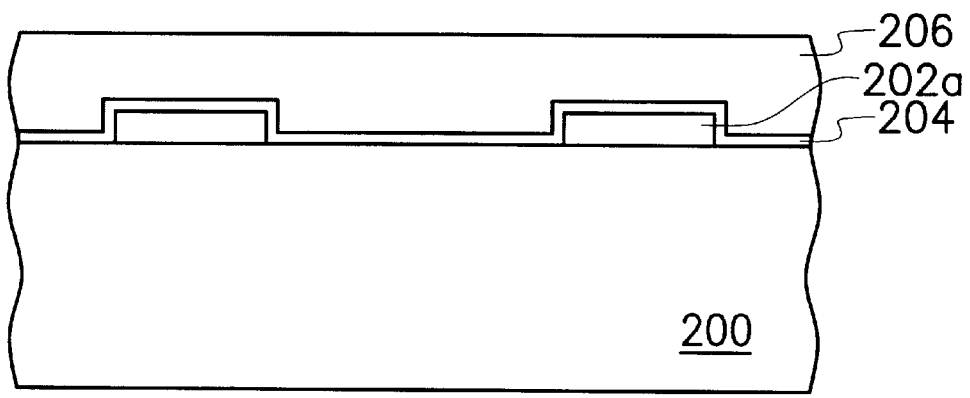
Figure 9:
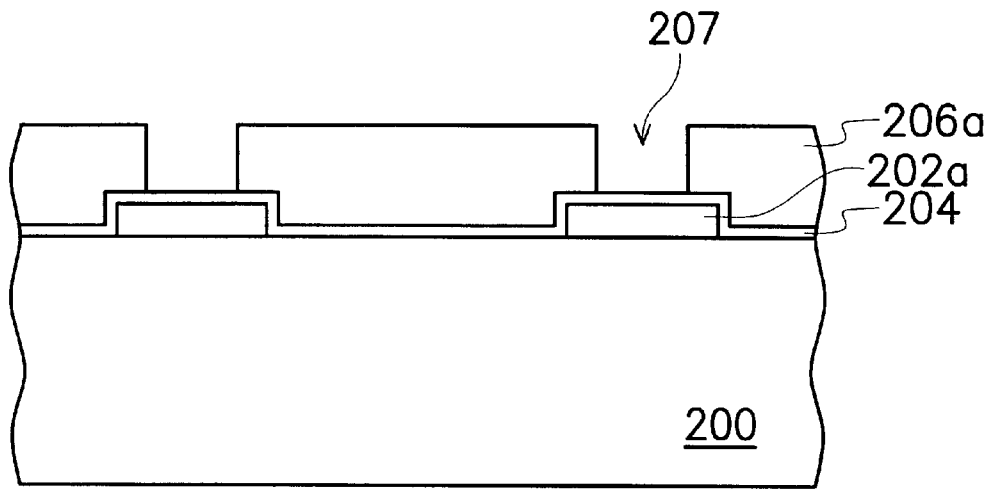

In FIG. 8, a photoresist 206 is formed on the copper layer 204. In FIG. 9, the photoresist 206 is patterned to form a patterned photoresist 206a having a plurality of openings 207 therein, such that the copper layer 204 on the pads 202a can be exposed through the openings 207. Each of the openings 207 is formed on each of the pads 202a, respectively. Patterning the photoresist 206 can be achieved by photography, development or laser removing, for example.

Figure 2:
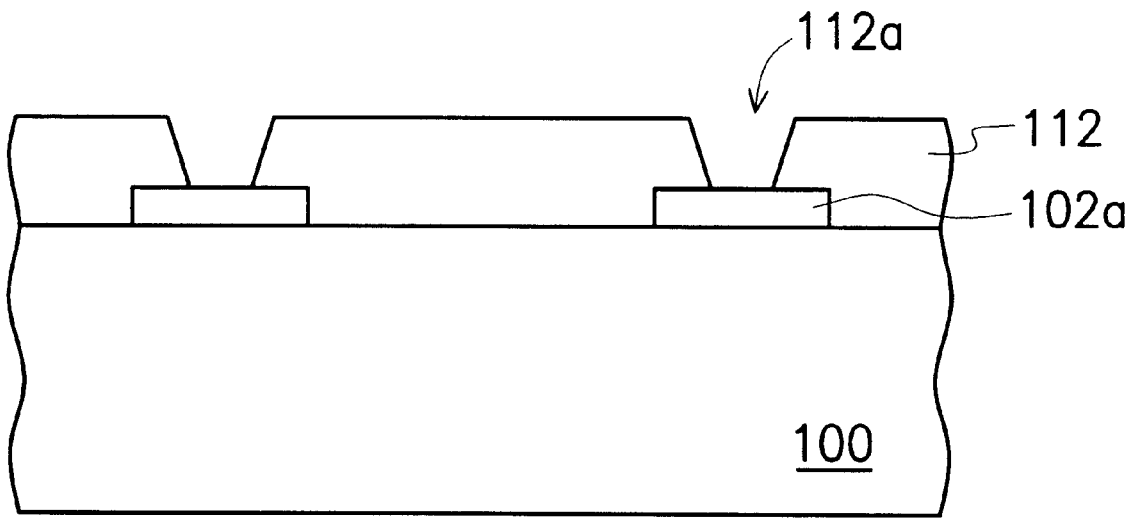

With the patterned photoresist 206a, the opening 207 thus formed in the patterned photoresist 206a is well defined compared to the prior art which forms the opening 112a in the patterned solder mask 112. Specifically, the opening 207 in the photoresist 206a according to the present invention has substantially vertical sidewalls as shown in FIG. 9, while the opening 112a in the solder mask 112 as shown in FIG. 2 has a tapered shape.

Figure 10:
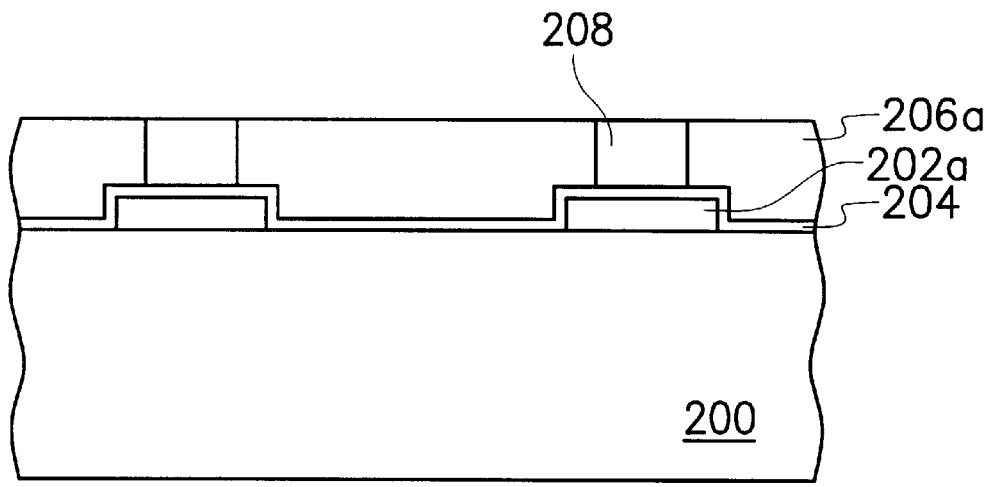
Figure 11:
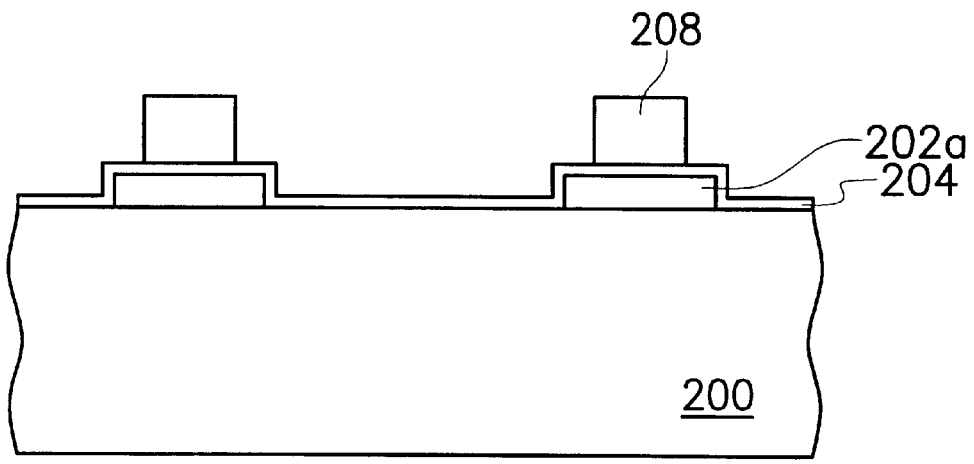

In FIG. 10, an opening 207 is filled with a conductive material to form a conductive plug 208. Forming the conductive plug 208 can be achieved by filling copper into the opening 207 by plating or sputtering using the copper layer 204 as a seed layer. Alternatively, the conductive plug 208 can be formed by printing or dipping. For example, a dry film overlies the patterned photoresist 206a with the opening 207 exposed, and then the patterned photoresist 206a is dipped into a metal melt. Subsequently, the photoresist 206 is removed to expose the conductive plug 208 and copper layer 204, as shown in FIG. 11.

Figure 12:
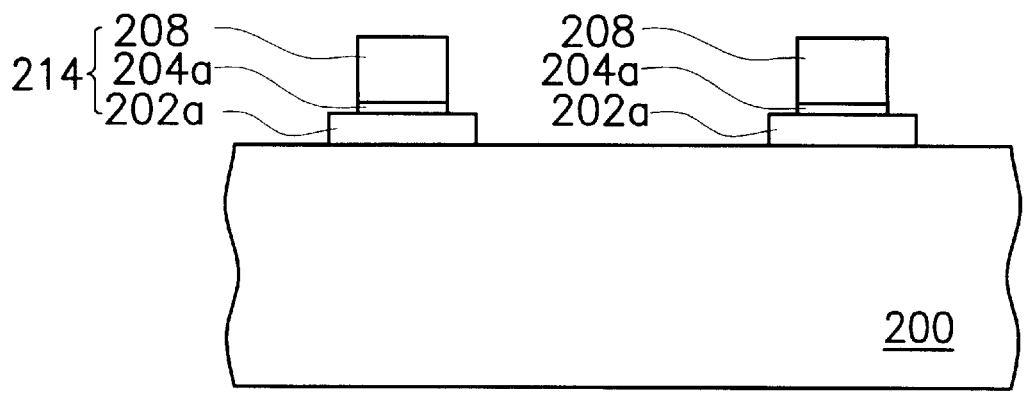

In FIG. 12, the copper layer 204 that is not covered by the conductive plug 208, and so exposed, is removed to avoid undesired electric connection. The copper layer 204a, the conductive plug 208 and the pad 202a form the external connector 214. Removing the copper layer 204 that is not covered by the conductive plug 208, and so exposed, can be achieved by a flash etching, for example. Since the copper layer 204 has a thickness smaller than the pad 202a and conductive plug 208, the pad 202a and the conductive plug 208 would not deteriorate during removal of the copper layer 204 by flash etching.

Figure 13:
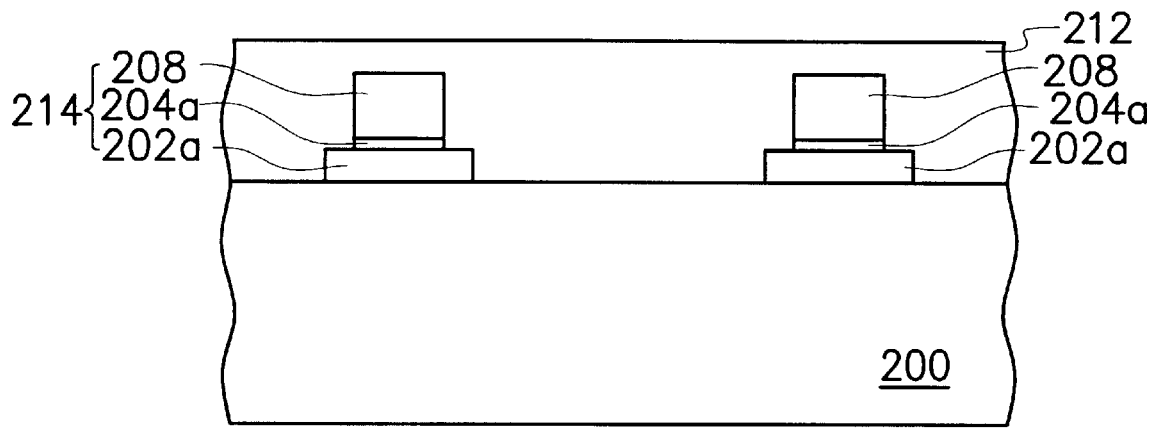
Figure 14:
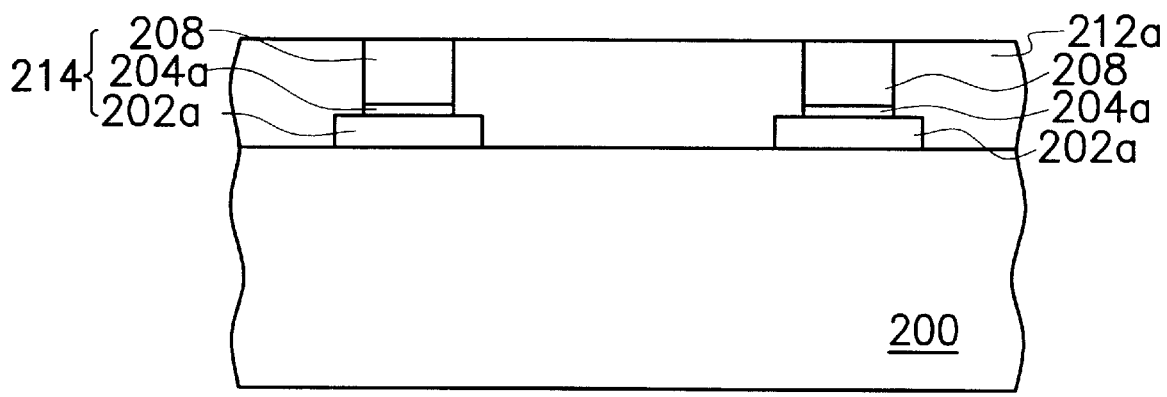

In FIG. 13, a solder resist layer 212 overlies the substrate 200 and the conductive plug 208. The solder resist layer 212 can be a solder mask that is well known in the art, or the like. In FIG. 14, the solder resist layer 212 is partially removed to form a solder resist 212a having a height the same as the external connector 214 and exposing the top surface of the external connector 214. An example of method of partially removing the solder resist 212 includes mechanically polishing and chemically removing.

In the invention, the opening 207 having sidewalls substantially vertical to the substrate 200 is formed in the patterned photoresist 206a. After the external connector 214 is formed in the opening 207, the solder resist layer 212 overlies the external connector 214 and the substrate 200. Then, the solder resist layer 212 is removed until the external connector 214 is exposed. The external connector 214 obtained by the present invention has sidewalls substantially vertical to substrate 200.

Furthermore, because the external connectors are first formed and spaced each from the other, and then the solder resist is formed there between, according to the present invention, the deficiency of the prior art, in that the solder resist layer still left after development must be removed, can be cured. Additionally, the yield of the external connector 214 in the substrate 200 can be improved over the prior art.

In the present invention, the external connector 214 has the same height as the solder resist 212a, which facilitates the subsequent processes, such as wire bonding between the chip and the substrate or electrically connecting between bumps on a flip chip and the substrate.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A method of producing an external connector, comprising:
    providing a substrate and a plurality of pads on the substrate;
    forming a copper layer on the substrate to cover the pads;
    forming a patterned photoresist on the copper layer, wherein the patterned photoresist has a plurality of openings to expose the copper layer which corresponds to the pads;
    forming a conductive plug on the exposed copper layer;
    removing the patterned photoresist;
    removing the copper layer which is not covered by the conductive plug;
    forming a solder resist over the substrate to cover the pads and the conductive plug; and
    removing a portion of the solder resist until the conductive plug is exposed, wherein the solder resist is as high as the conductive plug.

2. The method of claim 1, wherein forming the conductive plug includes plating and sputtering.

3. The method of claim 1, wherein forming the conductive plug includes printing and dipping.

4. The method of claim 1, wherein removing a portion of the solder resist includes mechanically polishing and chemically removing.

5. The method of claim 1, wherein the material used for the solder resist includes solder mask and the like.

6. The method of claim 1, wherein forming the patterned photoresist includes exposure and development.

7. The method of claim 1, wherein forming the patterned photoresist includes laser removing.

8. The method of claim 1, wherein the step of forming the pad comprises:
    forming a pad layer on the substrate;
    forming a patterned photoresist layer on the pad layer to expose portions of the pad layer to be removed;

removing the exposed pad layer to form a plurality of pads; and removing the patterned photoresist.

9. A method of producing an external connector, comprising:

providing a substrate and a plurality of pads on the substrate;

forming a copper layer on the substrate to cover the pads;

forming a patterned photoresist on the copper layer, wherein the patterned photoresist has a plurality of openings to expose the copper layer which corresponds to the pads;

forming a conductive plug on the exposed copper layer;

removing the patterned photoresist;

removing the copper layer which is not covered by the conductive plug; and forming a solder resist over the substrate to cover the pads and the conductive plug, wherein, the solder resist is as high as the conductive plug and the conductive plug is exposed.

10. The method of claim 9, wherein forming the conductive plug includes plating and sputtering.

11. The method of claim 9, wherein forming the conductive plug includes printing and dipping.

12. The method of claim 9, wherein the material used for the solder resist includes solder mask and the like.

13. The method of claim 9, wherein forming the patterned photoresist includes exposure and development.

14. The method of claim 9, wherein forming the patterned photoresist includes laser removing.

15. The method of claim 9, wherein the step of forming the pad comprises:

forming a pad layer on the substrate;

forming a patterned photoresist layer on the pad layer to expose portions of the pad layer to be removed;

removing the exposed pad layer to form a plurality of pads; and removing the patterned photoresist.

* * * * *